United States Patent
Tsai et al.

(10) Patent No.: US 9,053,781 B2
(45) Date of Patent: Jun. 9, 2015

(54) STRUCTURE AND METHOD FOR A FORMING FREE RESISTIVE RANDOM ACCESS MEMORY WITH MULTI-LEVEL CELL

(71) Applicant: TAIWAN SEMICONDCUTOR MANUFACTURING COMPANY, LTD., Hsin-Chu (TW)

(72) Inventors: Chun-Yang Tsai, New Taipei (TW); Yu-Wei Ting, Taipei (TW); Kuo-Ching Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 256 days.

(21) Appl. No.: 13/624,539

(22) Filed: Sep. 21, 2012

(65) Prior Publication Data

US 2013/0336041 A1 Dec. 19, 2013

Related U.S. Application Data

(60) Provisional application No. 61/660,116, filed on Jun. 15, 2012.

(51) Int. Cl.
*G11C 11/00* (2006.01)
*G11C 13/00* (2006.01)
*H01L 45/00* (2006.01)
*H01L 27/24* (2006.01)

(52) U.S. Cl.
CPC ............ *G11C 13/0002* (2013.01); *H01L 45/00* (2013.01); *H01L 45/08* (2013.01); *H01L 45/1233* (2013.01); *H01L 45/146* (2013.01); *H01L 45/1625* (2013.01); *H01L 45/1641* (2013.01); *H01L 27/2436* (2013.01); *G11C 13/0007* (2013.01); *G11C 2213/32* (2013.01); *G11C 2213/34* (2013.01)

(58) Field of Classification Search
USPC .................................. 365/148, 149, 100, 163
See application file for complete search history.

(56) References Cited

U.S. PATENT DOCUMENTS

| 7,778,063 | B2 * | 8/2010 | Brubaker et al. | 365/148 |
| 7,835,172 | B2 * | 11/2010 | Shinozaki | 365/148 |
| 8,009,454 | B2 * | 8/2011 | Lee et al. | 365/148 |

(Continued)

FOREIGN PATENT DOCUMENTS

WO   WO 2011008195 A2   1/2011

OTHER PUBLICATIONS

Z. Wei et al., "Demonstration of High-Density ReRAM Ensuring 10-Year Retention at 85°C Based On A Newly Developed Reliability Model", 2011 IEEE, 978-1-4577-0505-2/11/$26.00, IEDM11-721-724.

(Continued)

*Primary Examiner* — Pho M Luu
(74) *Attorney, Agent, or Firm* — Haynes and Boone, LLP

(57) ABSTRACT

A method for operating a multi-level resistive random access memory (RRAM) cell having a current-controlling device and a RRAM device connected together. The method is free of a "forming" step and includes setting the RRAM device to one of resistance levels by controlling the current-controlling device to one of current levels. The setting the RRAM device includes applying a first voltage to a top electrode of the RRAM device and applying a second voltage to a bottom electrode of the RRAM device. The second voltage is higher than the first voltage.

20 Claims, 9 Drawing Sheets

(56) References Cited

U.S. PATENT DOCUMENTS

| | | |
|---|---|---|
| 8,289,752 B2 * | 10/2012 | Lu et al. ............... 365/148 |
| 8,575,585 B2 | 11/2013 | Yang et al. |
| 2009/0039332 A1 | 2/2009 | Lee et al. |
| 2010/0034010 A1 * | 2/2010 | Xi et al. ............... 365/148 |
| 2010/0110758 A1 | 5/2010 | Li et al. |
| 2010/0123117 A1 | 5/2010 | Sun et al. |
| 2010/0285633 A1 | 11/2010 | Sun et al. |
| 2010/0327248 A1 | 12/2010 | Khoueir et al. |
| 2011/0095259 A1 | 4/2011 | Lee et al. |
| 2011/0220862 A1 | 9/2011 | Arita et al. |
| 2011/0291064 A1 | 12/2011 | Marsh et al. |
| 2011/0317470 A1 | 12/2011 | Lu et al. |
| 2012/0040528 A1 | 2/2012 | Kim et al. |
| 2012/0074374 A1 | 3/2012 | Jo |
| 2012/0178210 A1 | 7/2012 | Lee et al. |
| 2013/0001494 A1 | 1/2013 | Chen et al. |
| 2013/0028003 A1 | 1/2013 | Wang et al. |
| 2013/0187117 A1 | 7/2013 | Sandhu et al. |
| 2013/0207065 A1 | 8/2013 | Chiang |
| 2013/0215669 A1 * | 8/2013 | Haukness ............... 365/148 |
| 2013/0234099 A1 | 9/2013 | Sekar et al. |
| 2013/0334486 A1 | 12/2013 | Tsai et al. |
| 2014/0146593 A1 | 5/2014 | Tsai et al. |

OTHER PUBLICATIONS

Wong, H.-S. Philip, et al., "Metal-Oxide RRAM," 0018-9219/$31.00 © 2012 IEEE, 20 pages.

\* cited by examiner

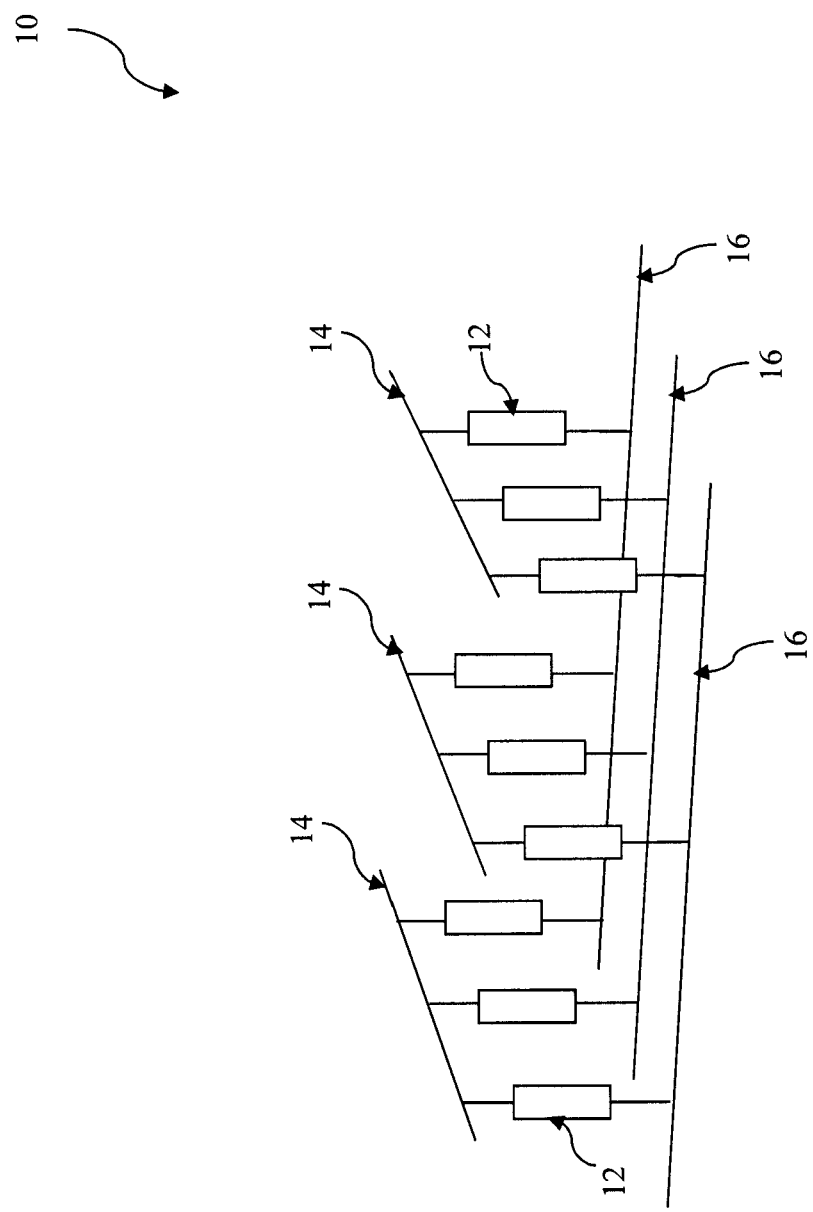

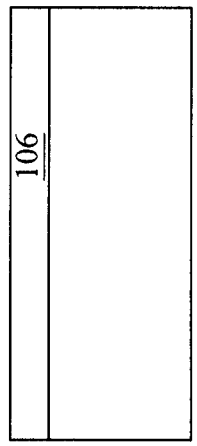
Fig. 7B
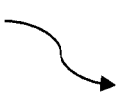
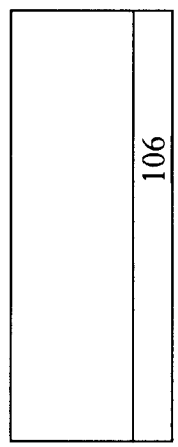
Fig. 7A
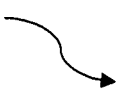
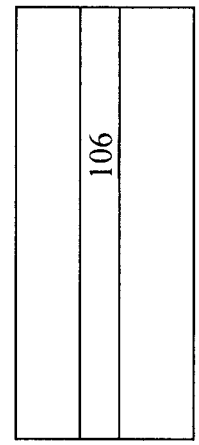
Fig. 7C

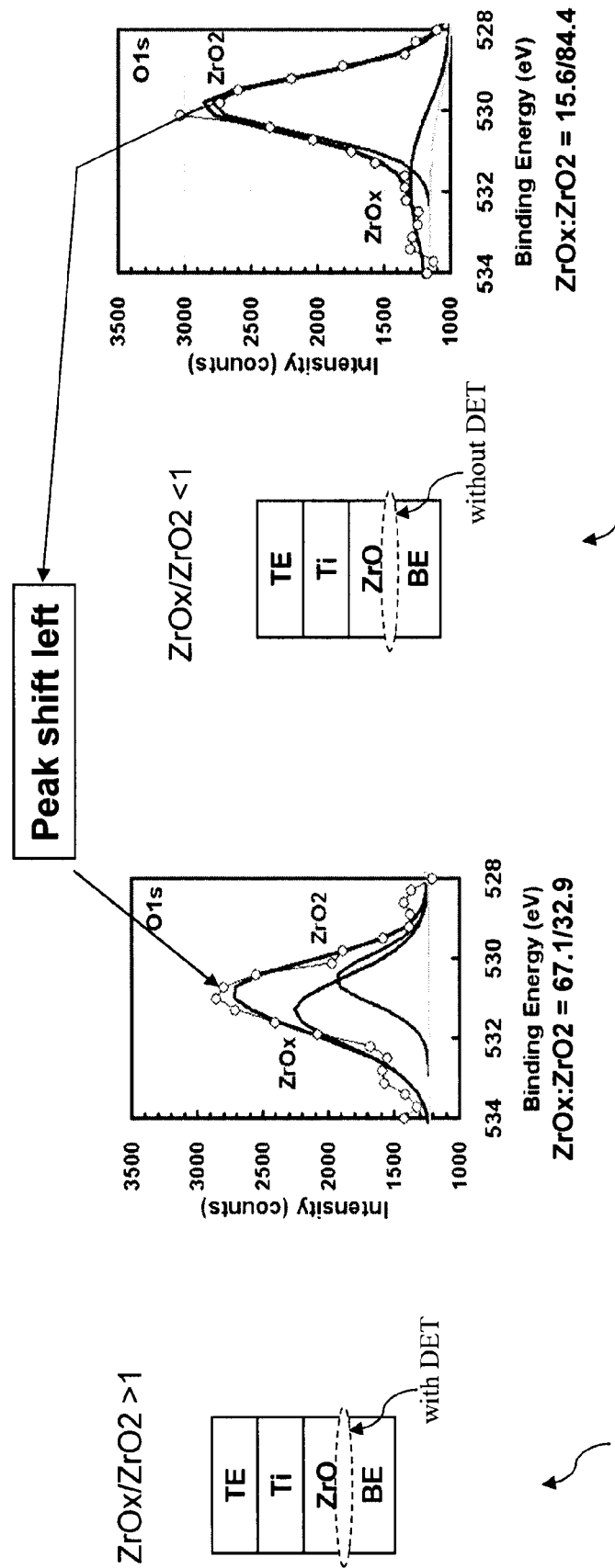

STRUCTURE AND METHOD FOR A FORMING FREE RESISTIVE RANDOM ACCESS MEMORY WITH MULTI-LEVEL CELL

PRIORITY DATA

This application claims priority to U.S. Provisional Patent Application Ser. No. 61/660,166 filed on Jun. 15, 2012, the entire disclosure of which is incorporated herein by reference.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." In advanced technology nodes, the feature size scales down and the size of memory devices is reduced accordingly. However, the reduction of the RRAM devices is limited due to the "forming" operation. In the "forming" process, a high voltage is applied to the RRAM device to generate a conductive path in the resistive material layer of the DRRAM device. The high "forming" voltage introduces reliability concern. Furthermore, the high current during the operations of the RRAM device leads to concerns of the high power consumption and reliability since high current means high current density. To reduce the current density, the size of the RRAM device needs to be big enough in the cost of the circuit packing density.

Accordingly, it would be desirable to provide an improved RRAM structure and method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a schematic view of a memory structure having a plurality of memory cells constructed according to aspects of the present disclosure in one embodiment.

FIGS. 7A-7C illustrate sectional views of a dielectric material layer in the memory device of FIG. 6 constructed according to aspects of the present disclosure in various embodiments.

FIGS. 8A-8B provide diagrams showing characteristic data of various memory devices in various embodiments.

DETAILED DESCRIPTION

Figure 3:
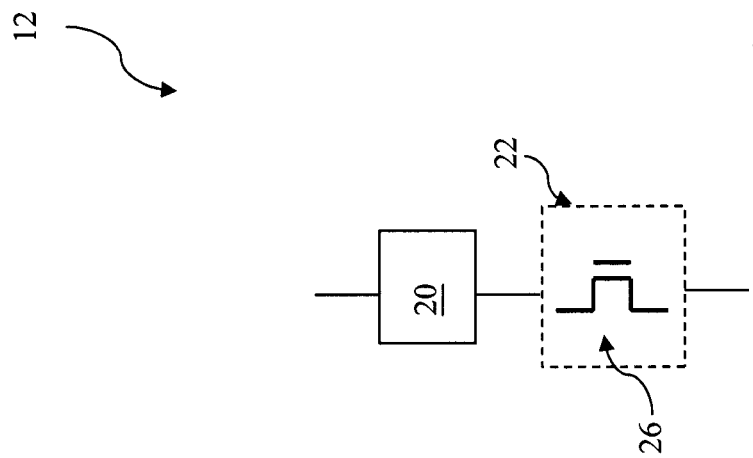
FIGS. 2 and 3 are schematic views of a memory cell of FIG. 1 having a resistive random access memory (RRAM) device and a current-controlling device constructed according to aspects of the present disclosure in various embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view of a memory structure 10 having a plurality of memory cells 12 constructed according to aspects of the present disclosure in one embodiment. The memory cells are configured in an array coupled with a plurality of word lines 14 and a plurality of bit lines 16. In one particular embodiment, the memory structure 10 includes one memory cell 12 and corresponding one word line 14 and one bit line 16. In one embodiment, the word lines 14 and the bit lines 16 are cross configured. Furthermore, each of the memory cells 12 is an ultra-low power resistive random access memory (RRAM) cell operable to achieve multiple resistance levels and accordingly multiple bit storage. The memory cells 12 are also referred to as multi-level cells and are further explained below.

Figure 2:
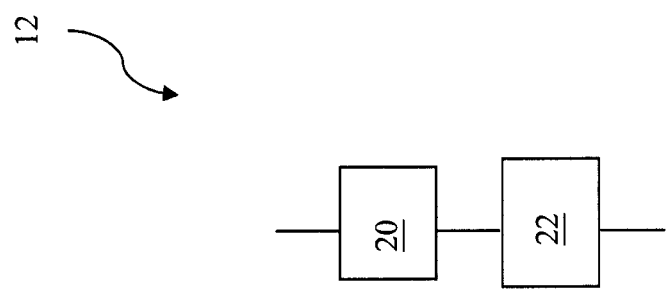
Figure 4:
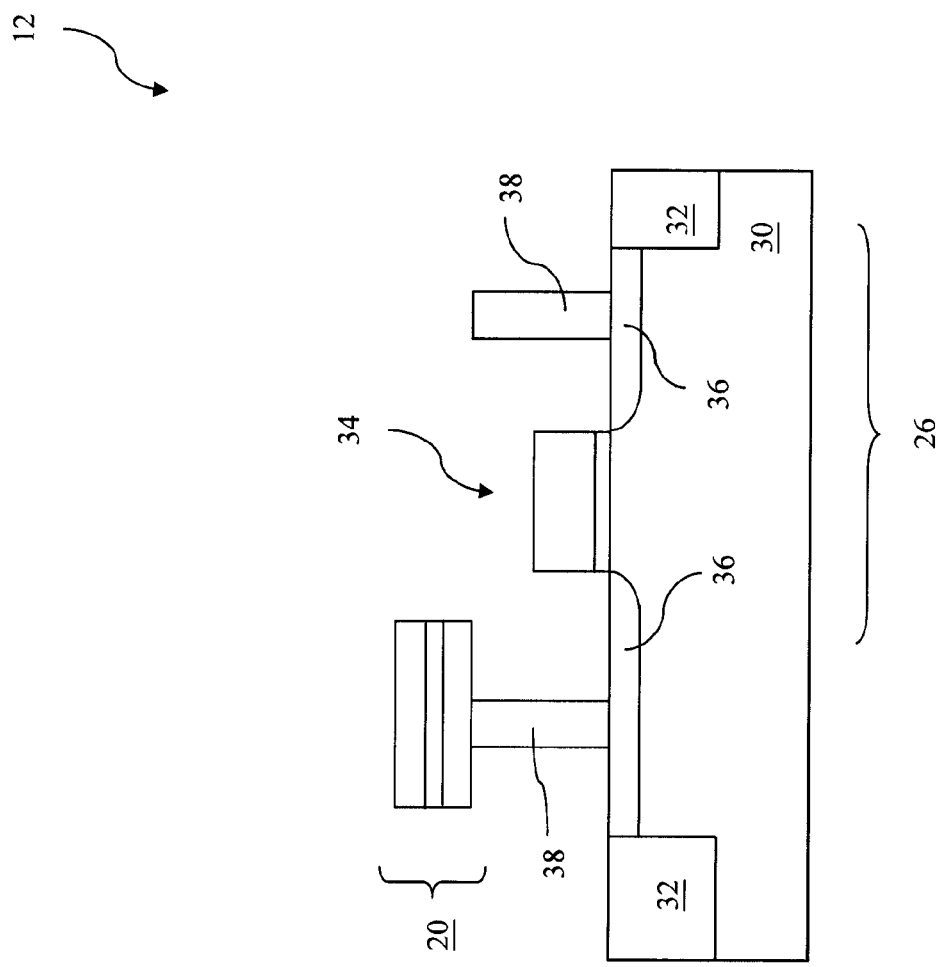
FIG. 4 is a sectional view of a memory cell of FIG. 1 having a resistive random access memory (RRAM) device and a current-controlling device constructed according to aspects of the present disclosure in one embodiment.

Referring to FIG. 2, the memory cell 12 includes a RRAM device 20 and a current-controlling device 22 connected together. The RRAM device 20 includes a resistive material layer (or a dielectric material layer) interposed between two electrodes. Especially, the dielectric material layer includes a defect engineering film formed by a technique including a defect engineering treatment (DET) process. The resistance of the RRAM device 20 is operable to be adjusted into multiple levels that represent different logic states, respectively. In one embodiment, the RRAM device 20 further includes a capping layer disposed between the dielectric layer and one of the electrodes. The structure of the RRAM device 20 and the method making the same are further described later with reference to FIGS. 5 through 10.

The current-controlling device 22 in the memory cell 12 is a device that is operable to control the current flow through the RRAM device 20 during the operations. In one embodiment, the current-controlling deice 22 is a transistor 26, such as a field effect transistor (FET), as illustrated in FIG. 3. For example, the transistor 26 is a metal-oxide-semiconductor (MOS) field effect transistor. In a particular example, the one electrode of the RRAM device is connected to the drain of the FET 26. The gate of the FET 26 is connected to the word line and the other electrode of the RRAM device 20 is connected to the bit line.

FIG. 3 illustrates a sectional view of the memory cell 12 that includes the FET 26 and the RRAM device 20 formed on a substrate 30 and coupled together. In one example, the substrate 30 is a semiconductor substrate, such as a silicon substrate or alternatively other suitable semiconductor substrate. Various isolation features 32, such as shallow trench isolation (STI) features are formed on the substrate 30 and define various active regions. The FET 26 includes a gate 34 disposed on the substrate 30. The gate includes a gate dielectric layer and a gate electrode disposed on the gate dielectric layer. In various examples, the gate dielectric layer includes a high k dielectric material and the gate electrode includes metal. The FET 26 further includes source and drain 36 formed in the substrate 30. The gate 34 is interposed between the source and drain 36.

The RRAM 20 includes a dielectric material layer interposed between the two electrodes. The memory cell 12 also includes various interconnect features 38 to electrically couple the RRAM device 20 and the FET 26 together. In furtherance of the embodiment, the drain of the FET 26 is connected to the bottom electrode of the RRAM deice 20. The gate 34 of the FET 26 is connected to the word line 14 and the top electrode of the RRAM device 20 is connected to the bit line 16.

The current-controlling device 22 may include other suitable device. In an alternative embodiment, the current-controlling device 22 includes a tunable resistor, such as a tunable MOS resistor.

Figure 5:
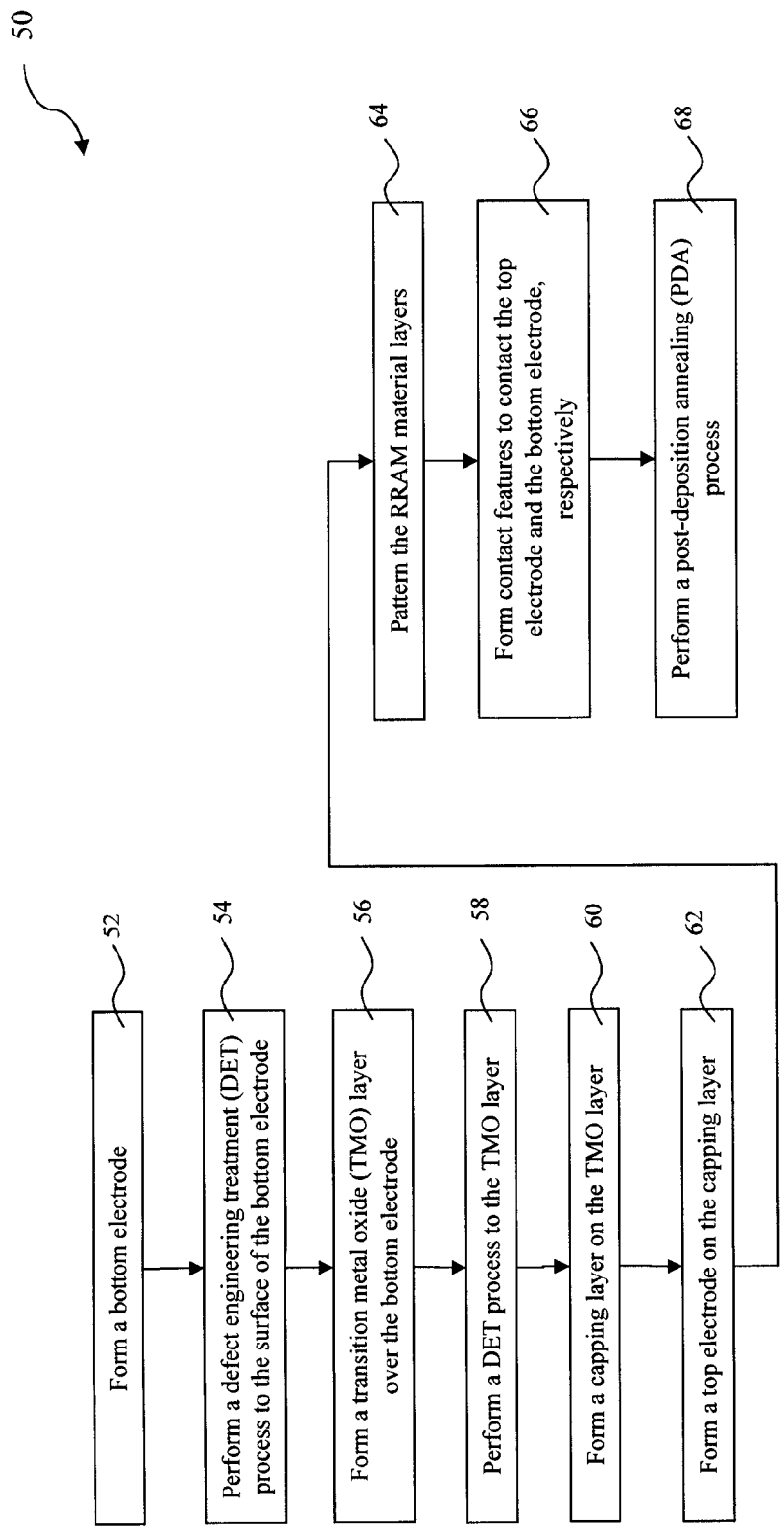
FIG. 5 is a flowchart of a method making of the RRAM device of FIG. 2 constructed according to aspects of the present disclosure in one or more embodiments.
Figure 6:
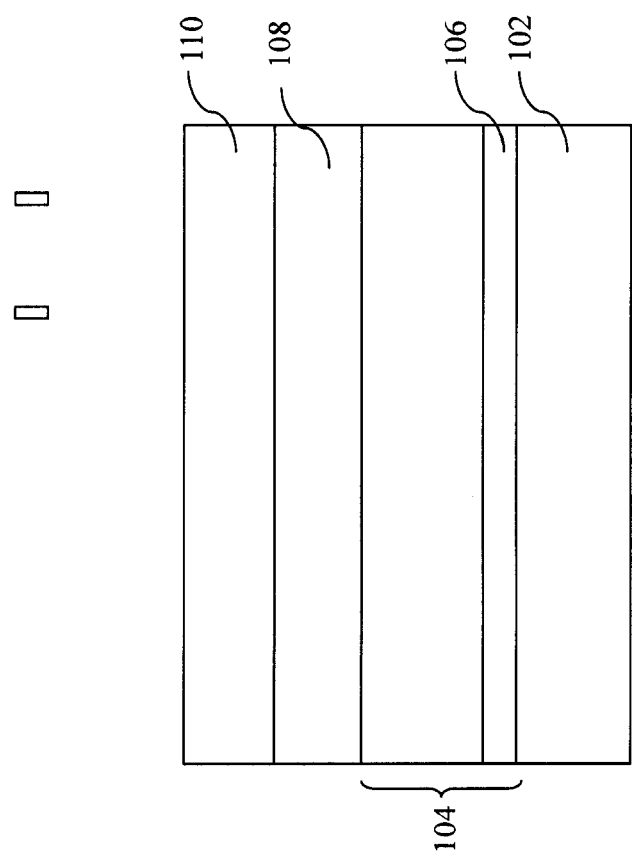
FIG. 6 is a sectional view illustrating an embodiment of the RRAM device of FIG. 2 constructed according to aspects of the present disclosure in one embodiment.

As noted above, the RRAM device 20 is designed to achieve multiple resistance levels. In operations, the RRAM device 20 is "forming" free and consumes an ultra-low power with substantially reduced leakage. FIG. 5 is a flowchart of a method 50 making of the RRAM device 20 constructed according to aspects of the present disclosure in various embodiments. FIG. 6 is a sectional view illustrating an embodiment of the RRAM device 20 constructed according to aspects of the present disclosure. FIGS. 7A-7C illustrate sectional views of the dielectric material layer in the RRAM device 20 constructed according to aspects of the present disclosure in various embodiments. With references to FIGS. 5 through 7C and other figures, the RRAM device 20 and the method 50 making the same are collectively described according to various embodiments.

Referring to FIG. 6, the RRAM device 20 includes a stack of material layers designed and configured to be operable of achieve multiple resistance levels and with ultra-low power consumption, with the coupled current-controlling device 22. Particularly, the RRAM device 20 has multiple resistive states achieved with current levels that are controllable by the current-controlling device 22 during setting operations. Especially, the RRAM device 20 has a much simple structure and is fabricated with less cost. The RRAM device 20 is formed on a semiconductor substrate, such as a silicon substrate, or alternatively other suitable substrate.

Referring to FIGS. 5 and 6, the method 50 includes a step 52 to form a first electrode (or bottom electrode) 102 of a conductive material. In one embodiment, the first electrode 102 includes titanium nitride (TiN). In another embodiment, the first electrode 102 includes tantalum nitride (TaN) or platinum (Pt). In other embodiments, the first electrode 102 may include other appropriate conductive materials for forming such an electrode, such as metal, metal nitride, doped polycrystalline silicon (doped poly silicon) or combinations thereof.

In one embodiment, the first electrode 102 includes a conductive material having a proper work function such that a high work function wall is built between the first electrode 102 and a resistive material layer subsequently formed. The first electrode 102 can be formed by atomic layer deposition (ALD), physical vapor deposition (PVD or sputtering), or alternatively other suitable processes.

In one embodiment, the first electrode 102 includes TiN and is formed an ALD process using a precursor including TiCl4 and NH3. In furtherance of the present embodiment, The ALD process has a deposition temperature ranging between about 200 C and about 500 C. In yet another embodiment, the first electrode 102 has a thickness ranging between about 100 angstrom and about 2000 angstrom.

The method 50 includes a step 54 by performing a defect engineering treatment (DET) process to the first electrode 52. The DET process is designed to generate defects in an interface between the first electrode 102 and a dielectric material layer to be formed at a subsequent fabrication stage. In the present embodiment, the DET process applies a gas to the RRAM device 20 at a raised temperature. In furtherance of the present embodiment, the DET process includes applying ammonia gas (NH3) to the first electrode 102. The ammonia gas is heated directly or indirectly to a temperature ranging between about 200 C and about 500 C.

In another embodiment, the DET process includes applying a gas, such as NH3, N2, O2, O3, H2O, Cl2, Ar, CF4, H2, N2O, SiH4, CF4, or a combination thereof. During the DET process, the applied gas is directly heated to a high temperature or alternatively, is indirectly heated to the high temperature, such as by heating the RRAM device 20.

The method 50 includes a step 56 by forming a dielectric material layer (or a resistive material layer) 104 on the first electrode 102. The dielectric material of the dielectric material layer 104 has a characteristic mechanism that its resistivity can be switched between a high resistance state and a low resistance state (or conductive), by applying an electrical voltage. In various embodiments, the dielectric material layer 104 includes metal oxide, metal oxynitride or combinations thereof. In the present embodiment, the dielectric material layer 104 includes a transition metal oxide (TMO). In one example, the dielectric material layer 104 includes zirconium oxide. In other examples, the dielectric material layer 104 includes tantalum oxide or hafnium oxide.

The dielectric material layer 104 may be formed by a suitable technique, such as ALD with a precursor containing zirconium and oxygen. In another example, the dielectric material layer 104 may be formed by PVD, such as a PVD process with a zirconium target and with a gas supply of oxygen to the PVD chamber. The dielectric material layer 104 has a proper thickness for improved memory device performance including retaining time, reliable data storage, and writing easiness. In one example, the dielectric material layer 104 includes a thickness ranging between about 20 angstrom and about 200 angstrom.

The method 50 includes a step 58 by performing a DET process to the dielectric material layer 104. The DET process at the step 58 is similar to the DET process at the step 54. The DET is designed to generate defects on the dielectric material layer 104. In the present embodiment, the DET process applies a gas to the RRAM device 20 at a raised temperature. In furtherance of the present embodiment, the DET process includes applying ammonia gas (NH3) to the dielectric material layer 104. In one example, the ammonia gas is heated directly or indirectly to a temperature ranging between about 200 C and about 500 C.

In another embodiment, the DET process includes applying a gas, such as NH3, N2, O2, O3, H2O, Cl2, Ar, CF4, H2, N2O, SiH4, CF4, or a combination thereof. During the DET process, the applied gas is directly heated to a high temperature or alternatively, is indirectly heated to a high temperature.

In other alternative embodiments, the method 50 may includes only one of the first DET process at step 54 and the second DET process at step 58. In another embodiment, the DET process may be applied during the deposition of the dielectric material layer. For example, a first portion of the dielectric material layer 104 is deposited, a DET process is applied to the first portion of the dielectric material layer 104, and thereafter a second portion of the dielectric material layer 104 is deposited on the treated first portion of the dielectric material layer 104.

In another embodiment, the formation of the dielectric material layer 104 and the DET process are simultaneously implemented. For example, the dielectric material layer 104 is formed by PVD using a zirconium target and an oxygen-containing gas. The gas supplied to the PVD chamber may further include a gas for DET, such as ammonia. In another example, the gas supplied to the PVD chamber may further include NH3, N2, O2, O3, H2O, Cl2, Ar, CF4, H2, N2O, SiH4, CF4, or a combination thereof. In yet another example, the gas for the DET is heated before introducing to the RRAM device 20 or during the deposition of the dielectric material layer 104.

The DET process is designed to eventually generate defects in the dielectric material layer 104 so the respective RRAM device is tuned to have a characteristic of current vs. voltage (I-V) to achieve multiple resistance levels, "forming" free and ultra-low power consumption. A defect engineering film 106 is generated in the dielectric material layer 104. The defect engineering film 106 is capable of depriving oxygen and generating oxygen vacancies in the dielectric material layer 104. In the present embodiment, the defect engineering layer 106 is formed in the interface between the resistive material layer 104 and the bottom electrode 102.

The method 50 may include a step 60 to form a capping layer 108 on the dielectric material layer 104. The capping layer 108 includes a conductive material that is unstable and is capable of depriving oxygen from adjacent material. In the present embodiment, the capping layer 108 includes titanium (Ti) and may be formed by PVD or other suitable technique. In another embodiment, the capping layer 108 has a thickness ranging between about 20 angstrom and about 200 angstrom.

In other embodiments, the capping layer 108 includes Ti, tantalum (Ta) or hafnium (Hf). In another embodiment, the capping layer 108 includes metal oxide. In yet other embodiments, the capping layer 108 and the dielectric material layer 104 are chosen to have a pair of a conductive material and a dielectric material, such as titanium (Ti) and zirconium oxide; or tantalum and tantalum oxide; or hafnium and hafnium oxide. However, the capping layer 108 may be eliminated in other embodiment.

The method 50 includes a step 62 by forming a second electrode (or top electrode) 110 on the capping layer 108 or on the dielectric material layer 104 (if the capping layer 108 is not present). In one embodiment, the top electrode 110 includes tantalum nitride (TaN). The top electrode 110 may be formed by PVD or other suitable technique. In another embodiment, the second electrode 110 has a thickness ranging between about 100 angstrom and about 2000 angstrom. Alternatively, the top electrode 110 includes other suitable conductive material to electrically connect the device to other portion of an interconnect structure for electrical routing. In other embodiments, the second electrode 110 includes metal, metal-nitride, doped polysilicon or other suitable conductive material.

The method 50 includes a step 64 to pattern the various material layers to form one or more RRAM device. Particularly, the bottom electrode 102 and the top electrode 110 are defined by patterning. In one embodiment, the various RRAM material layers (such as the resistive material layer 104, the capping 108 and the two electrodes) are patterned by a procedure that includes lithography process and etch. For example, a hard mask is deposited on the top electrode 110 and is patterned by a lithography process and an etch process; and then the various RRAM material layers are etched through the openings of the hard mask. The hard mask is used as an etch mask and may include a suitable dielectric material, such as silicon oxide, silicon nitride, other dielectric material or a combination thereof. In another embodiment, a patterned resist layer is used as an etch mask.

In another embodiment, the top electrode 110 and the bottom electrode 102 are patterned differently in two patterning procedure. In the first procedure to pattern the top electrode 110, a hard mask is deposited on the top electrode 110 and is patterned by a lithography process and an etch process; and then the top electrode 110 is etched through the openings of the hard mask. In another embodiment, a patterned resist layer is used as an etch mask. In the present embodiment, various material layers of the RRAM device 20 including top electrode 110, capping layer 108 and dielectric material layer 104 are collectively patterned.

Then the bottom electrode 102 is patterned. In one embodiment, the bottom electrode 102 is patterned by a procedure similar to the procedure to pattern the top electrode 110. In one embodiment, the procedure includes a lithography process and an etch process. For example, an etch mask (hard mask or a patterned resist layer) is formed; and then the bottom electrode 102 is etched through the openings of the etch mask. In the present embodiment, the bottom electrode 102 is patterned such that the bottom electrode 102 is partially uncovered by the top electrode 110 for proper electrical routing. Alternatively, the two patterning procedure may be designed differently (such as in a different sequence) to define (or pattern) the top and bottom electrodes.

The method 50 may further include a step 66 by forming contact features configured to contact the top electrode 110 and the bottom electrode, respectively. The contact features are configured to connect the top electrode 110 and the bottom electrode 102, respectively. The contact features include one or more conductive material and may be formed by various suitable techniques. In one embodiment, the contact features are formed by a procedure that includes dielectric deposition, contact hole etch and metal deposition. This procedure is described below.

An interlayer dielectric material layer, such as silicon oxide or low k dielectric material, is deposited on the RRAM device 20 by a technique, such as chemical vapor deposition (CVD). The interlayer dielectric material layer may be further polished to planarize the top surface of the RRAM device 20 by a technique, such as chemical mechanical polishing (CMP). The interlayer dielectric material layer may be formed by other method such as a procedure that includes spin-on coating and curing.

Various contact holes are formed in the interlayer dielectric material layer by a procedure that includes lithography process and etch. For example, a hard mask is formed on the interlayer dielectric material layer and the hard mask includes various openings that define regions for contact holes. An etch process is applied to the interlayer dielectric material layer using the hard mask as an etch mask. Then a conductive material is formed in the contact holes by a technique, such as PVD, CVD, plating or combinations thereof. The conductive material includes aluminum copper alloy, copper, tungsten, silicide, other metals, or a combination thereof. A CMP process may be applied to remove excessive deposited conductive material and planarize the top surface of the RRAM device 20.

The method 50 may further include a step 68 to perform a post-deposition annealing (PDA) process to the RRAM device 20. The PDA process is designed to further generate oxygen vacancies in the dielectric material layer 104. In one embodiment, the PDA process has an annealing temperature ranging between about 300 C and about 500 C. In one example, one or more DET process and the PDA process are collectively contribute to form the dielectric material layer 104 having a defect engineering film 106 or a defect engineering surface.

Other steps may be implemented before, during and/or after the method 50. In one example, various active devices, such as field effect transistors, may be formed in the substrate by ion implantation, annealing and other processes. In another example, various interconnect features, including metal lines and via features may be formed on the substrate to provide electrical routing to various devices including one or more RRAM cells, forming a functional integrated circuit.

Referring back to FIGS. 7A-7C, the defect engineering film 106 and the dielectric material layer 104 are further described in term of the DET process and with further consideration of the capping layer 108 and/or PDA process. The defect engineering film 106 is able to deprive oxygen from and generate oxygen vacancies in the dielectric material layer 104 such that the RRAM structure has a characteristic behavior of a CRSRAM device.

The DET process (either applied to the first electrode 102 at step 54 or applied to the dielectric material layer 104 at step 58) can effectively generate defects and the defect engineering film 106 in the dielectric material layer 104. The defect engineering film 106 may be generated in various portions of the dielectric material layer 104 associated with different embodiments of the defect engineering treatment in the method 50.

FIGS. 7A-7C provide sectional views of the dielectric material layer 104 constructed according to different embodiments. In one embodiment as illustrated in FIG. 7A, the defect engineering layer 106 is formed on the bottom portion of the dielectric material layer 104. Particularly, the defect engineering film 106 is formed in the interface between the dielectric material layer 104 and the first electrode 102. In this embodiment, the step 54 is implemented on the bottom electrode 102. Accordingly, the bottom electrode 102, or a top portion of the bottom electrode, is changed by the respective DET process. After the dielectric material layer 104 is deposited, the bottom portion 106 of the dielectric material layer 104 is reacted with the bottom electrode 102 (or further enhanced by the PDA process) to generate defects on the portion 106 of the dielectric material layer 104. In this example, the portion 106 of the dielectric material layer 104 is converted into the defect engineering film 106.

In another embodiment as illustrated in FIG. 7B, the defect engineering layer 106 is formed on the top portion of the dielectric material layer 104. Particularly, the defect engineering film 106 is formed in the interface between the dielectric material layer 104 and the second electrode 110 (or the capping layer 108 if present). In this embodiment, the step 58 is implemented on the dielectric material layer 104. Accordingly, a top portion 106 of the dielectric material layer 104 is modified (or further enhanced by the capping layer 108 and/or the PDA process) to generate defects on the top portion 106 of the dielectric material layer 104. In this example, the top portion 106 of the dielectric material layer 104 is converted into the defect engineering film 106.

In yet another embodiment as illustrated in FIG. 7C, the defect engineering layer 106 is in the dielectric material layer 104. Particularly, the defect engineering film 106 is formed in the dielectric material layer 104 away from both surfaces. In this embodiment, a DET process is implemented during the formation of the dielectric material layer 104. For example, a first portion of the dielectric material layer 104 is deposited. A DET process is applied to the first portion of the dielectric material layer 104. Then a second portion of the dielectric material layer 104 is deposited after the DET process. Accordingly, a portion 106 of the dielectric material layer 104 is modified (or further enhanced by the PDA process) to generate defects on the portion 106 of the dielectric material layer 104. In this example, the portion 106 of the dielectric material layer 104 is converted into the defect engineering film 106 embedded in the dielectric material layer 104.

In other embodiments, the dielectric material layer 104 may include more than one defect engineering films 106 formed on top surface of, bottom surface of or embedded in the dielectric material or various combinations thereof. The defect engineering films 106 serve the same purpose to generate more defects (such as oxygen vacancies) in the dielectric material layer 104. The contribution of the defect (such as oxygen vacancies) may be further enhanced by the capping layer 108 and/or the PDA process at step 68.

The dielectric material layer 104 behaves differently because the structure of the dielectric material layer 104 is changed by the DET process (or the defect engineering film). In one example, the dielectric material layer 104 includes zirconium oxide $ZrO_2$ and $ZrO_x$. The subscript x has a value less than 2. A ratio of $ZrO_x/ZrO_2$ in the dielectric material layer 104 is greater than 1. This is further explained with reference to FIGS. 8A-8B.

FIGS. 8A-8B provide diagrams showing characteristic data of various memory devices according to various embodiments. The characteristic data are experimental data from X-ray photoelectron spectroscopy (XPS) taken from particular samples. The data of FIG. 8A are from a sample 122 of a RRAM device fabricated with DET process. The sample 122 is one example of the RRAM device 20. Particularly, the sample 122 includes a dielectric material layer of zirconium oxide treated by one or more DET process. The analysis indicates that the ratio of $ZrO_x/ZrO_2$ of the dielectric material layer is greater than 1. In this particular example, the ratio of $ZrO_x/ZrO_2$ in the dielectric material layer of the sample 122 is 67.1/32.9.

As a comparison, the data of FIG. 8B are from a sample 124 of a memory device fabricated without DET process. The sample 124 is substantially similar to the sample 122 but fabricated without being treated by a DET process. The analysis indicates that the ratio of $ZrO_x/ZrO_2$ of the dielectric material layer is less than 1. In this particular example, the ratio of $ZrO_x/ZrO_2$ in the dielectric material layer of the sample 124 is 15.6/84.4. Furthermore, compared with the sample 124, the O1s spectrum of the sample 122 has a left-shift.

Figure 9:
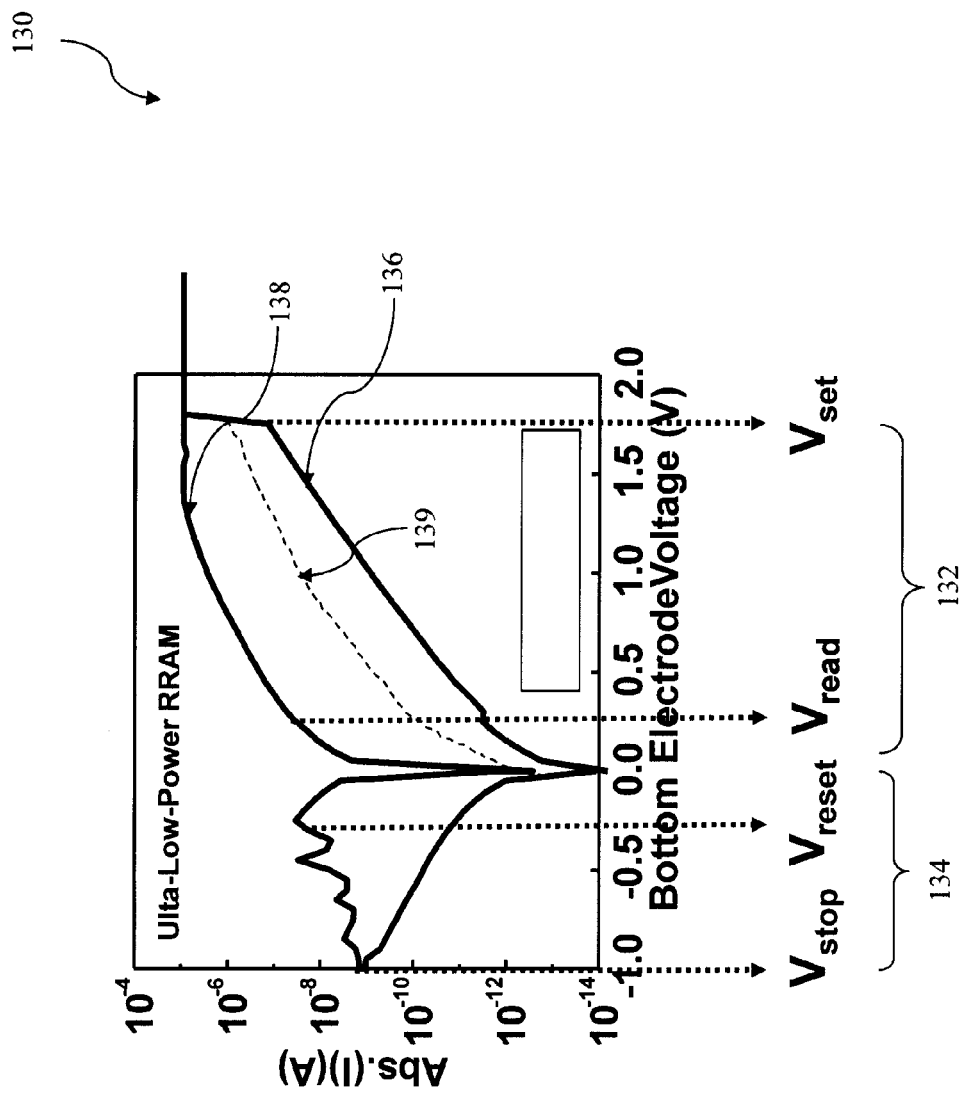
FIG. 9 is a diagram illustrating a current vs. voltage behavior of the RRAM device of FIG. 2 in one embodiment.

FIG. 9 is a diagram illustrating a current vs. voltage curve (I-V curve) 130 of the RRAM device 20 according to one embodiment. The I-V curve 130 is constructed according to experimental data from one sample of the RRAM device 20. The horizontal axis represents a voltage applied to RRAM device 20 (or a bias voltage applied to the bottom electrode in one example). The corresponding unit is volt (or V). The vertical axis represents a current through the RRAM device 20. The corresponding unit is ampere (or A).

The I-V curve 130 shows hysteric behavior as a RRAM device. Particularly, the I-V curve 130 is related to the operations without "forming" operation. The I-V curve 130 shows asymmetric behavior. The current through the resistive material layer 104 at either HR or LR state is very low (less than about $10^{-6}$ A for example). Due to the low current and "forming" free, the corresponding power consumption of the RRAM device 20 is ultra-low.

Specifically, the RRAM device 20 has multiple resistive states that can be setting by controlling the current level in the setting operations. The I-V curve 130 includes a first voltage range 132 that is positive or in one polarity and a second voltage range 134 that is negative or in opposite polarity. The operations "set" and "read" are in the first voltage range 132 with a first polarity and the operation "reset" is in the second voltage range with a second polarity opposite from the polarity. Therefore, the operations of the RRAM deice 20 are in a bipolar mode. Various voltage points in the I-V curve 130 are labeled as $V_{set}$, $V_{reset}$, $V_{stop}$ and $V_{read}$, respectively. Those points are further explained later when various operations are discussed.

The I-V curve 130 includes a high resistance (HR) state 136 and a low resistance (LR) state 138. Therefore, the dielectric material layer 104 is able to function as data storage. The LR state 136 and HR state 138 represent "on" (or "1") and "off" (or "0"), respectively, or vise versa. Particularly, the I-V curve 130 additionally includes one or more different resistive states 139 that has a resistance lower than that of the resistance of the HR state 136 and higher than that of the resistance of the LR state 138. The various resistance states 139 are achievable by controlling the current flowing through the RRAM device 20 during the "set" operations.

Figure 10:
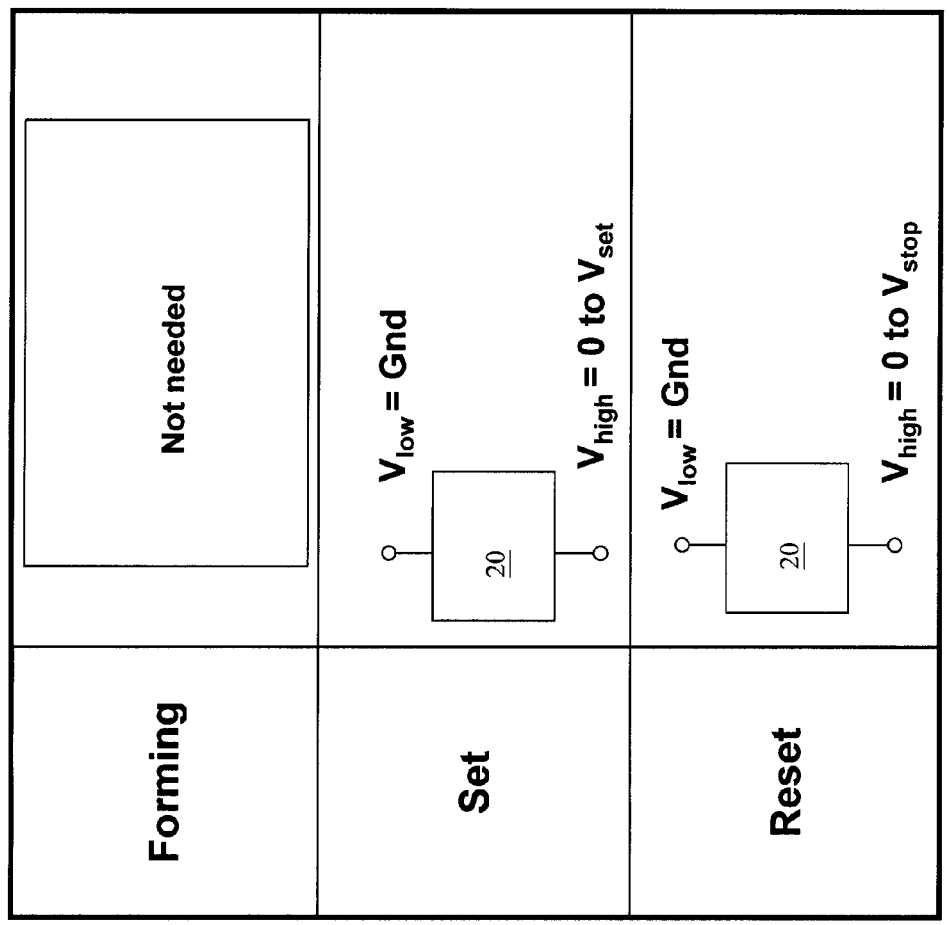
FIG. 10 is a table illustrating various operations of the RRAM device of FIG. 2 constructed according to aspects of the present disclosure in one or more embodiment.

Various operations applied to the RRAM device 20 during application are provided in FIG. 10 that includes an operation table 140. Those operations are described with reference to FIGS. 9 and 10. First, the "forming" operation is not needed in the use of the RRAM device 20 in the RRAM cell 12. Therefore, the RRAM cell 12 is "forming" free.

The "set" operation is illustrated in the second row of the operation table 140. In the "set" operation, the top electrode of the RRAM deice 20 is biased with a low voltage $V_{low}$, such as grounding ("Gnd"). The bottom electrode of the RRAM deice 20 is biased to a high voltage $V_{high}$. The difference between the high voltage and low voltage provides a "set" voltage. In the operation "set", the "set" voltage is applied to the two electrodes of the RRAM device 20. The "set" voltage sets the resistive material layer 104 into a LR state 138. The "set" voltage is in the first voltage range 132. The "set" voltage starts from 0 and increases to $V_{set}$ or even higher. When $V_{low}$ is grounded, $V_{high}$ is from 0 to $V_{set}$ or even higher. Especially, when the current during the "set" operation is controlled by the current-controlling device 22 into different levels, the resistive material layer 104 is set to different resistive states 139, to achieve multi-level setting and multi-bit storage in one cell.

Another operation is "reset" that is illustrated in the third row of the operation table 140. In the operation "reset", a "reset" voltage is applied to the two electrodes of the RRAM device 20, with "reset" voltage in the second voltage range 134 or opposite polarity. In the "reset" operation, the bottom electrode of the RRAM deice 20 is biased with a low voltage $V_{low}$, such as grounding ("Gnd"). The top electrode of the RRAM device 20 is biased to a high voltage $V_{high}$. The difference between the high voltage and low voltage provides a "reset" voltage. In the "reset" operation, the "reset" voltage resets the dielectric material layer 104 into the HR state 136. The "reset" voltage is in the second voltage range 134 varies from 0 to $V_{reset}$ or higher. In the present context, the $V_{reset}$ voltage refers to only the magnitude of the voltage difference and therefore is positive. The $V_{stop}$ is defined similarly. To completely reset the resistive material layer 104 to the LR state, the "reset" voltage needs to reach $V_{stop}$. When $V_{low}$ is grounded, $V_{high}$ is from 0 to $V_{stop}$. In the present example, $V_{reset}$ is about 0.3 V and $V_{stop}$ is about 1 V.

Other operations include "read" to retrieve the data stored in the RRAM device 20. As described above, the RRAM device 20 has multiple resistance levels and multi-bit storage. The "read" voltage is in the first voltage range 132 with the first polarity. In the "read" operation, the top electrode of the RRAM deice 20 is biased with a low voltage $V_{low}$, such as grounding ("Gnd"). The bottom electrode of the RRAM deice 20 is biased to a high voltage $V_{high}$. The difference between the high voltage and low voltage provides a "read" voltage. In the "read" operation, the "read" voltage may be any voltage in the first voltage range 132. In the present example, the "read" voltage is chosen at about $V_{read}$.

The present disclosure provides one embodiment of a resistive random access memory (RRAM) structure. The RRAM structure includes a current-controlling device on a substrate; and a RRAM device formed on the substrate and connected with current-controlling device configured to be operable of turning the RRAM device to different resistance levels. The RRAM device includes a bottom electrode; a resistive material layer on the bottom electrode, the resistive material layer including a defect engineering film; and a top electrode on the resistive material layer.

In one embodiment, the structure includes a word line and a bit line. The bit line is connected to the RRAM device and the word line is connected to the current-controlling device.

In another embodiment, the current-controlling device includes field-effect transistor having a source, a drain and a gate disposed between the source and drain.

In yet another embodiment, the drain of the field effect transistor is connected to the bottom electrode of the RRAM device; the word line is connected to the gate of the field effect transistor; and the bit line is connected to the top electrode of the RRAM device.

In yet another embodiment, the gate further includes a gate dielectric layer formed on the substrate; and the resistive material layer includes a transition metal oxide.

In yet another embodiment, the resistive material layer includes a dielectric material selected from a metal oxide and a metal oxynitride. In yet another embodiment, the resistive material layer includes a transition metal oxide.

In yet another embodiment, the resistive material layer includes zirconium oxide $ZrO2$ and $ZrOx$ with a ratio of $ZrOx/ZrO2$ being greater than 1, wherein x is a number less than 2.

In yet another embodiment, the structure further includes a capping layer disposed between the resistive material layer and the top electrode. In yet another embodiment, the capping layer and the resistive material layer are a pair of materials selected from the group consisting of titanium and zirconium oxide; tantalum and tantalum oxide; and hafnium and hafnium oxide.

The present disclosure also provides a method for operating a multi-level resistive random access memory (RRAM)

cell having a current-controlling device and a RRAM device connected together according to one or more embodiments. The method is free of a "forming" step and includes setting the RRAM device to one of resistance levels by controlling the current-controlling device to one of current levels. The setting the RRAM device includes applying a first voltage to a top electrode of the RRAM device and applying a second voltage to a bottom electrode of the RRAM device. The second voltage is higher than the first voltage.

In one embodiment, the setting the RRAM device includes applying a set voltage in a first polarity to the RRAM device.

In another embodiment, the method further includes resetting the RRAM device by applying a reset voltage in a second polarity opposite to the first polarity.

In yet another embodiment, the first polarity is from the top electrode to the bottom electrode; and the set voltage is defined as a difference between the second voltage and the first voltage.

In yet another embodiment, the setting the RRAM device to one of resistance levels includes grounding the top electrode of the RRAM device. In yet another embodiment, the first voltage is equal to $V_{set}$ or higher.

In yet another embodiment, the resetting the RRAM device includes biasing a top electrode of the RRAM cell to a high voltage; and biasing a bottom electrode of the RRAM device to a low voltage.

In yet another embodiment, the resetting the RRAM device includes grounding the bottom electrode of the RRAM device.

In yet another embodiment, the second voltage is defined as a difference between the high voltage and the low voltage, wherein the second voltage is equal to $V_{stop}$ or higher.

In yet another embodiment, the method further includes reading the RRAM device by applying a third voltage in the first polarity to the RRAM device. In yet another embodiment, the third voltage is less than the first voltage.

In yet another embodiment, the bottom electrode includes titanium nitride; the resistive material layer includes zirconium oxide; the capping layer includes titanium; and the top electrode includes tantalum nitride.

The present disclosure also provides an embodiment of a method for making a resistive random access memory (RRAM) structure. The method includes forming a current-controlling device on a substrate; and forming a RRAM device configured to be connected with the current-controlling device. The forming a RRAM device further includes forming a bottom electrode; forming a dielectric material layer on the bottom electrode; performing a defect engineering treatment (DET) process; and forming a top electrode on the dielectric material layer.

In one embodiment, the DET process includes applying a NH3 gas to the RRAM structure at a treatment temperature ranging between about 200 C and about 500 C.

In another embodiment, the DET process includes applying a gas selected from the group consisting of NH3, N2, O2, O3, H2O, Cl2, Ar, CF4, H2, N2O, SiH4, CF4, and combinations thereof.

In yet another embodiment, the performing a DET process includes applying the DET process to the bottom electrode before the forming of a dielectric material layer.

In yet another embodiment, the method further includes forming a capping layer on the dielectric material layer before the forming a top electrode.

In yet another embodiment, the performing a DET process includes applying the DET process to the dielectric material layer before the forming a capping layer.

In yet another embodiment, the forming a dielectric material layer on the bottom electrode and the forming a capping layer on the first dielectric material layer include forming a transition metal oxide layer and a metal layer selected from the group consisting of zirconium oxide and titanium; tantalum oxide and tantalum; and hafnium oxide and hafnium.

In yet another embodiment, the method further includes performing a post-deposition annealing (PDA) process to the RRAM device with an annealing temperature ranging between about 300 C and about 500 C.

The present disclosure also provides an embodiment of a method for operating a RRAM cell having a current-controlling device and a RRAM device connected together. The method includes setting the RRAM device to one of resistance levels by controlling the current-controlling device to one of current levels.

In one embodiment, the method further includes resetting the RRAM device by applying a first voltage in a polarity opposite to a second voltage applied to the RRAM device for setting. In another embodiment, the method further includes reading the RRAM device by a third voltage much less than the second voltage.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for operating a multi-level resistive random access memory (RRAM) cell having a current-controlling device and a RRAM device connected together, the method being free of a "forming" step and comprising setting the RRAM device to one of resistance levels by controlling the current-controlling device to one of current levels, wherein the setting the RRAM device includes applying a first voltage to a top electrode of the RRAM device and applying a second voltage to a bottom electrode of the RRAM device, the second voltage being higher than the first voltage, wherein setting the RRAM device occurs without the RRAM device having previously undergone the "forming" step, wherein the "forming" step generates a conductive path in a resistive material layer of the RRAM device.

2. The method of claim 1, further comprising resetting the RRAM device by applying a reset voltage in a second polarity opposite to the first polarity, and
   wherein the setting the RRAM device includes applying a set voltage in a first polarity to the RRAM device.

3. The method of claim 2, wherein
   the first polarity is from the top electrode to the bottom electrode; and
   the set voltage is defined as a difference between the second voltage and the first voltage.

4. The method of claim 3, wherein the setting the RRAM device to one of resistance levels includes grounding the top electrode of the RRAM device.

5. The method of claim 3, wherein the first voltage is equal to $V_{set}$ or higher.

6. The method of claim 2, wherein the resetting the RRAM device includes:
   biasing a top electrode of the RRAM cell to a high voltage; and biasing a bottom electrode of the RRAM device to a low voltage.

7. The method of claim 6, wherein the resetting the RRAM device includes grounding the bottom electrode of the RRAM device.

8. The method of claim 6, wherein the second voltage is defined as a difference between the high voltage and the low voltage, wherein the second voltage is equal to $V_{stop}$ or higher.

9. The method of claim 2, further comprising reading the RRAM device by applying a third voltage in the first polarity to the RRAM device.

10. The method of claim 9, wherein the third voltage is less than the first voltage.

11. A method of making a resistive random access memory (RRAM) structure, comprising:
forming a current-controlling device on a substrate; and
forming a RRAM device configured to be connected with the current-controlling device, wherein the forming the RRAM device further includes:
forming a bottom electrode;
forming a dielectric material layer on the bottom electrode;
performing a defect engineering treatment (DET) process; and
forming a top electrode on the dielectric material layer.

12. The method of claim 11, wherein the DET process includes applying a $NH_3$ gas to the RRAM structure at a treatment temperature ranging from about 200 C to about 500 C.

13. The method of claim 11, wherein the DET process includes applying a gas selected from the group consisting of $NH_3$, $N_2$, $O_2$, $O_3$, $H_2O$, $Cl_2$, Ar, $CF_4$, $H_2$, $N_2O$, $SiH_4$, $CF_4$, and combinations thereof.

14. The method of claim 11, wherein the performing the DET process includes applying the DET process to the bottom electrode before the forming of the dielectric material layer.

15. The method of claim 11, further comprising forming a capping layer on the dielectric material layer before the forming the top electrode.

16. The method of claim 15, wherein the performing the DET process includes applying the DET process to the dielectric material layer before the forming the capping layer.

17. The method of claim 15, wherein:
the forming the dielectric material layer on the bottom electrode and the forming the capping layer on the dielectric material layer include forming a transition metal oxide layer and a metal layer selected from the group consisting of zirconium oxide and titanium; tantalum oxide and tantalum; and hafnium oxide and hafnium.

18. The method of claim 11, further comprising performing a post-deposition annealing (PDA) process to the RRAM device with an annealing temperature ranging from about 300 C to about 500 C.

19. A method for operating a multi-level resistive random access memory (RRAM) cell having a current-controlling device and a RRAM device connected together, the method comprising:
setting the RRAM device to one of resistance levels by applying a first voltage in a first polarity to the RRAM device; and
resetting the RRAM device by applying a second voltage in a second polarity to the RRAM device, wherein
the second polarity is opposite to the first polarity,
the current-controlling device is configured to be operable of turning the RRAM device to different resistance levels, and
the RRAM device includes a resistive material layer having a defect engineering film, and
wherein setting the RRAM device occurs without the RRAM device having previously undergone a forming step, wherein the forming step generates a conductive path in the resistive material layer of the RRAM device.

20. The method of claim 19, wherein the RRAM device includes a top electrode layer disposed over the resistive material layer and a bottom electrode layer disposed under the resistive material layer,
wherein the defect engineering film physically contacts at least one material layer selected from the group consisting of the top electrode layer and the bottom electrode layer, and
wherein the defect engineering film has a first oxygen concentration less than a second oxygen concentration of a portion of the resistive material layer.

* * * * *